(12) United States Patent
Zhu

(10) Patent No.: US 10,914,589 B2
(45) Date of Patent: *Feb. 9, 2021

(54) MODULE FIDUCIAL MARKERS FOR ROBOT NAVIGATION, ADDRESS MARKERS AND THE ASSOCIATED ROBOTS

(71) Applicant: Hangzhou AMLJ Technology Company, Ltd., Hangzhou (CN)

(72) Inventor: Jianqiang Zhu, Hangzhou (CN)

(73) Assignee: Hangzhou AMLJ Technology Company, Ltd., Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/803,225

(22) Filed: Nov. 3, 2017

(65) Prior Publication Data

US 2018/0356230 A1    Dec. 13, 2018

(30) Foreign Application Priority Data

Jun. 9, 2017   (CN) .......................... 2017 1 0437399

(51) Int. Cl.
*G01C 21/00* (2006.01)
*G01R 33/00* (2006.01)
(Continued)

(52) U.S. Cl.
CPC .......... *G01C 21/005* (2013.01); *G01C 21/04* (2013.01); *G01C 21/20* (2013.01); *G01C 21/206* (2013.01);
(Continued)

(58) Field of Classification Search
CPC .... G01C 21/005; G01C 21/206; G01C 21/04; G01C 21/20; G06K 7/082; G06K 19/06187; G06K 7/10; G01R 33/0005
See application file for complete search history.

(56) References Cited

U.S. PATENT DOCUMENTS 4,470,031 A * 9/1984 Steingroever ......... H01F 13/003
                                                                335/284
4,861,018 A   8/1989 Kerstein
(Continued)

FOREIGN PATENT DOCUMENTS

CA    2898374 A1    1/2016
CA    2916879 C     4/2017
(Continued)

OTHER PUBLICATIONS

USPTO; Non-Final Office Action for U.S. Appl. No. 15/959,960 dated Jan. 29, 2019.
(Continued)

*Primary Examiner* — Genna M Mott
(74) *Attorney, Agent, or Firm* — NK Patent Law

(57) ABSTRACT

The present invention discloses a module for robot navigation, an address marker and an associated robot. The module divides a whole workspace area for robot traveling into a plurality of module areas, and each module area is internally provided with a first magnetic piece having a polarity of an N pole or an S pole and a second magnetic piece having a polarity different from the polarity of the first magnetic piece. The first magnetic piece is a first magnetic strip, and the second magnetic piece is a second magnetic strip. The first magnetic strip is arranged in the Y-axis direction, and the second magnetic strip is arranged in the X-axis direction. A third magnetic strip and a fourth magnetic strip are further included. The four strips are in cross arrangement. The polarity of the second magnetic strip, the polarity of the third magnetic strip and the polarity of the fourth magnetic strip are the same. A plurality of magnetic induction sensors and an address marker recognition device are installed at the bottom of the robot. The robot can travel forward or backward or turn to a target module area according to instructions and collected marker information. The module for robot (Continued)

navigation, the address marker and the associated robot according to the present invention have beneficial effects of reliable and accurate positioning, low cost and convenient maintenance.

16 Claims, 4 Drawing Sheets

(51) Int. Cl.
| | |
|---|---|
| *G05D 1/02* | (2020.01) |
| *G01C 21/20* | (2006.01) |
| *G06K 7/10* | (2006.01) |
| *G01C 21/04* | (2006.01) |
| *G06K 7/08* | (2006.01) |
| *G06K 19/06* | (2006.01) |

(52) U.S. Cl.
CPC ......... *G01R 33/0005* (2013.01); *G06K 7/082* (2013.01); *G06K 7/10* (2013.01); *G06K 19/06187* (2013.01)

(56) References Cited

U.S. PATENT DOCUMENTS

| | | | |
|---|---|---|---|
| 4,990,841 A * | 2/1991 | Elder | G05D 1/0263 180/168 |
| 5,875,434 A | 2/1999 | Matsuoka et al. | |
| 5,963,134 A | 10/1999 | Bowers et al. | |
| 6,122,895 A | 9/2000 | Schubert | |
| 6,429,016 B1 | 8/2002 | McNeil | |
| 6,600,418 B2 | 7/2003 | Francis et al. | |
| 6,775,588 B1 | 8/2004 | Peck | |
| 6,895,301 B2 | 5/2005 | Mountz | |
| 7,038,573 B2 | 5/2006 | Bann | |
| 7,063,256 B2 | 6/2006 | Anderson et al. | |
| 7,119,689 B2 | 10/2006 | Mallett et al. | |
| 7,221,276 B2 | 5/2007 | Olsen, III et al. | |
| 7,402,018 B2 | 7/2008 | Mountz et al. | |
| 7,597,187 B2 | 10/2009 | Bausenwein et al. | |
| 7,734,729 B2 | 6/2010 | Du et al. | |
| 7,826,919 B2 | 11/2010 | DAndrea et al. | |
| 7,912,574 B2 | 3/2011 | Wurman et al. | |
| 7,991,505 B2 | 8/2011 | Lert, Jr. et al. | |
| 8,280,547 B2 | 10/2012 | DAndrea et al. | |
| 8,442,266 B2 | 5/2013 | Berger et al. | |
| 8,515,575 B2 | 8/2013 | Pfeiffer | |
| 8,565,912 B2 | 10/2013 | Wappling et al. | |
| 8,594,834 B1 | 11/2013 | Clark et al. | |
| 8,639,382 B1 | 1/2014 | Clark et al. | |
| 8,712,872 B2 | 4/2014 | Smith et al. | |
| 8,718,814 B1 | 5/2014 | Clark et al. | |
| 8,731,708 B2 | 5/2014 | Shakes et al. | |
| 8,892,240 B1 | 11/2014 | Vliet et al. | |
| 8,983,649 B2 * | 3/2015 | Checketts | G05D 1/0265 700/228 |
| 8,994,504 B1 | 3/2015 | Schatz et al. | |
| 9,008,831 B1 | 4/2015 | Jacobs et al. | |
| 9,010,517 B2 | 4/2015 | Hayduchok et al. | |
| 9,037,286 B2 | 5/2015 | Lert | |
| 9,062,999 B2 | 6/2015 | Brouhard et al. | |
| 9,067,744 B2 | 6/2015 | Takizawa et al. | |
| 9,152,149 B1 | 10/2015 | Palamarchuk et al. | |
| 9,187,268 B2 | 11/2015 | Denninger et al. | |
| 9,317,034 B2 | 4/2016 | Hoffman et al. | |
| 9,342,811 B2 | 5/2016 | Mountz et al. | |
| 9,346,620 B2 | 5/2016 | Brunner et al. | |
| 9,412,280 B1 | 8/2016 | Zwillinger et al. | |
| 9,436,184 B2 | 9/2016 | DAndrea et al. | |
| 9,492,924 B2 | 11/2016 | Bradski et al. | |
| 9,499,346 B2 | 11/2016 | Triesenberg, III et al. | |
| 9,519,882 B2 | 12/2016 | Galluzzo et al. | |
| 9,540,190 B2 | 1/2017 | Jochim et al. | |
| 9,597,714 B2 | 3/2017 | Felse et al. | |
| 9,600,798 B2 | 3/2017 | Battles et al. | |
| 9,611,107 B2 | 4/2017 | Wernersbach et al. | |
| 9,646,369 B2 | 5/2017 | Salzman et al. | |
| 9,656,804 B2 | 5/2017 | Lyon et al. | |
| 9,802,759 B2 | 10/2017 | Lert, Jr. | |
| 9,855,586 B2 | 1/2018 | Chirol et al. | |
| 9,950,863 B2 | 4/2018 | OBrien et al. | |
| 10,598,493 B2 * | 3/2020 | Zhu | G01C 21/20 |
| 2004/0073333 A1 | 4/2004 | Brill | |
| 2006/0261772 A1 * | 11/2006 | Kim | G05D 1/0255 318/587 |
| 2007/0065258 A1 | 3/2007 | Benedict et al. | |
| 2007/0071585 A1 | 3/2007 | Henkel | |
| 2008/0190735 A1 | 8/2008 | Luoma | |
| 2010/0183409 A1 * | 7/2010 | Checketts | B62D 5/0418 414/231 |
| 2010/0188078 A1 * | 7/2010 | Foletto | G01R 33/0005 324/251 |
| 2012/0197477 A1 | 8/2012 | Colwell | |
| 2012/0253507 A1 | 10/2012 | Eldershaw et al. | |
| 2012/0290125 A1 | 11/2012 | Perry | |
| 2014/0118117 A1 * | 5/2014 | Zomchek | G01S 5/14 340/10.5 |
| 2014/0135977 A1 | 5/2014 | Wurman et al. | |
| 2014/0379532 A1 | 12/2014 | Agasti et al. | |
| 2015/0081090 A1 | 3/2015 | Dong | |
| 2015/0139762 A1 * | 5/2015 | Stephens | E04H 6/22 414/261 |
| 2015/0375398 A1 | 12/2015 | Penn et al. | |
| 2016/0234986 A1 | 8/2016 | Jacobsson et al. | |
| 2017/0260008 A1 | 9/2017 | DeWitt et al. | |
| 2018/0039282 A1 | 2/2018 | Gupta et al. | |
| 2018/0111808 A1 | 4/2018 | Hoeltgen et al. | |
| 2018/0275680 A1 | 9/2018 | Gupta et al. | |
| 2019/0064785 A1 | 2/2019 | Wurman et al. | |
| 2019/0079537 A1 * | 3/2019 | Yoshida | G05D 1/0274 |
| 2019/0126323 A1 * | 5/2019 | Futch | G06K 19/06028 |
| 2019/0218035 A1 * | 7/2019 | Futch | B65G 1/1375 |

FOREIGN PATENT DOCUMENTS

| | | |
|---|---|---|
| CN | 103331266 A | 10/2013 |
| CN | 103354797 A | 10/2013 |
| CN | 104525488 A | 4/2015 |
| CN | 105057219 A | 11/2015 |
| CN | 204817212 U | 12/2015 |
| CN | 204817213 U | 12/2015 |
| CN | 103354797 B | 5/2016 |
| CN | 105929740 A | 9/2016 |
| CN | 206661696 U | 11/2017 |
| CN | 107458828 A | 12/2017 |
| EP | 1590272 B1 | 8/2010 |
| EP | 3138792 A1 | 3/2017 |
| JP | 2000288476 A | 10/2000 |
| JP | 2016534953 A | 11/2016 |
| WO | WO2012123513 A1 | 9/2012 |
| WO | WO2016125000 A1 | 8/2016 |
| WO | WO2016193785 A1 | 12/2016 |
| WO | WO2017074028 A1 | 5/2017 |

OTHER PUBLICATIONS

USPTO; Non-Final Office Action for U.S. Appl. No. 15/959,960 dated Jun. 25, 2018.

USPTO; Final Office Action for U.S. Appl. No. 15/959,960 dated Sep. 24, 2018.

USPTO; Advisory Action for U.S. Appl. No. 15/959,960 dated Dec. 26, 2018.

* cited by examiner

MODULE FIDUCIAL MARKERS FOR ROBOT NAVIGATION, ADDRESS MARKERS AND THE ASSOCIATED ROBOTS

CROSS-REFERENCE TO RELATED APPLICATIONS

This application claims priority to Chinese Patent Application No. 201710437399.3 filed on Jun. 9, 2017. The entire content of which is hereby incorporated by reference.

TECHNICAL FIELD

The present invention relates to module fiducial markers for robotic navigation, address markers, and the associated robots.

BACKGROUND

Robots can be navigated in a variety of ways during transportation, loading, unloading, and other tasks. For example, the robots can be navigated through a global positioning system (GPS), or can also be navigated through fiducial markers. When the robots are used for parcel sorting, a sorting system has hundreds of robots moving at the same time. At present, the most common method is to perform navigation by collecting fiducial marker information. The most common fiducial marker format is a two-dimensional code. The two-dimensional code includes both direction indication and position indication. When the robot moves from one module area to another module area, the robot reads two-dimensional code information, and responds by going straight, going backward, turning and the like according to instructions. Such two-dimensional codes have a good error tolerance rate; decoding of the position information can even be performed in the absence of some information. Information at four corners of the two-dimensional code represents direction information, and the direction information can be used to enable the robot to determine its direction. However, when any piece of information at the four corners of the two-dimensional code fails to be read, the direction cannot be determined. A failure to read the information at the four corners will arise when abrasion, blockage by foreign matter, and the like, occur on the two-dimensional code.

SUMMARY

According to the aforementioned shortcomings, the present invention provides module fiducial markers for robot navigation, wherein the robot position within a module is determined by arrangement of magnetic material. The magnetic material forms the fiducial markers within a module.

The technical solutions of the present invention are as follows:

A module for robot navigation, dividing a whole workspace for robot travel into a plurality of module areas, wherein each module area includes:

a first magnetic piece having a polarity of North or South; and a second magnetic piece having a polarity different from the polarity of the first magnetic piece.

It should be noted that the position of the two magnetic pieces having different polarities can be arbitrarily set, and the magnetic pieces may have various shapes. The robot can be guided by the two magnetic pieces having different polarities as long as the magnetic induction sensors of the robot account for the position and shape of the magnetic pieces.

To improve the utilization of the magnetic pieces, the module area should be maximized to facilitate identification by the robot. Preferably, the first magnetic piece is a first magnetic strip, and the second magnetic piece is a second magnetic strip.

It should be noted that the shapes of the magnetic pieces are arbitrary and in this case the magnetic strips are rectangular. When the magnetic pieces are set as magnetic strips, the positions of the two magnetic strips can also be arbitrarily set.

Preferably, the first magnetic strip is arranged in the Y-axis direction; and the second magnetic strip is arranged in the X-axis direction.

It should be noted that the first magnetic strip and the second magnetic strip are arranged according to the plane coordinates. The placement of the plane coordinates will determine the travel direction and the position of the robot within the module. The robot can travel forward or backward or turn according to instructions. The first magnetic strip and the second magnetic strip may or may not intersect. If the magnetic strips intersect, the intersection position is equivalent to the origin of the coordinates. Since the magnetic fields overlap at the intersection, the magnetic induction sensors on the robot cannot collect signals at the intersection, resulting in a waste of magnetic strips and magnetic induction sensors. Therefore, a non-intersecting structure should be chosen.

Preferably, the following is further included:

a third magnetic strip arranged in the X-axis direction, where the polarity of the third magnetic strip is the same as the polarity of the second magnetic strip.

It is to be noted that the length of the first magnetic strip can be equal to the length of the second magnetic strip plus the length of the third magnetic strip. However, it is best to have a symmetrical structure where the first magnetic strip, the second magnetic strip and the third magnetic strip are the same length. In this case, the magnetic strip in the X-axis direction is longer than the magnetic strip in the Y-axis direction, therefore the alignment accuracy of the robot in the X-axis direction is higher than that in the Y-axis direction. If the robot takes the Y-axis direction as the main travel direction, this solution is preferred.

Furthermore, the following is further included:

a fourth magnetic strip arranged in the Y-axis direction, where the polarity of the fourth magnetic strip is the same as the polarity of the second magnetic strip and the polarity of the third magnetic strip.

The magnetic strips having different polarities do not intersect, and the magnetic strips having the same polarity may or may not intersect.

The first magnetic strip, the second magnetic strip, the third magnetic strip and the fourth magnetic strip are in a cross arrangement.

The distances between the cross center and the farthest ends of the first magnetic strip, the second magnetic strip, the third magnetic strip and the fourth magnetic strip are the same.

The magnetic strips are directly attached to the module area.

When the magnetic strips are relatively thin, the magnetic strips do not substantially affect robot travel. Alternatively, the wheels of the robot can be designed to avoid the magnetic strips.

Each module area may be provided with a magnetic material plate, and the magnetic material plate is directly magnetized to form the North pole or South pole magnetic strips.

For convenience in installation and magnetization, the magnetic material plate may be selected, wherein the size of the magnetic material is such that the plate may fill the entire module area or occupy only the central area of the module.

Preferably, the plurality of module areas is arranged in a matrix, and the module areas are square.

The present invention further discloses an address marker to identify the individual module location within the entire workspace. The module includes the module fiducial markers and further includes an address marker. Each module is provided with a unique address marker.

The module fiducial marker can only provide the position and direction within the module area. The address markers provide the position of the module area within the whole workspace area.

The address marker is a bar code, a two-dimensional code, a graphic mark, a color mark, a size mark, or a radio frequency identification (RFID) tag.

The present invention further discloses a robot which identifies marker information using magnetic induction sensors and another address marker recognition device. The robot travels over the fiducial markers, and a plurality of magnetic induction sensors and an address marker recognition device are installed at the bottom of the robot. The plurality of magnetic induction sensors can collect signals of the magnetic strips having different polarities, and the address marker recognition device can collect the address information. The plurality of magnetic induction sensors and the address marker recognition device are connected to a robot controller, such that the robot can travel forward or backward or turn to a target module area according to instructions and collected location information.

Preferably, the magnetic induction sensors are the Hall effect sensors.

Provided that the plurality of Hall effect sensors can collect the signals of two magnetic strips having different polarities, the position and direction of the robot within the module area can be determined. The plurality of Hall effect sensors can be arranged in a variety of ways, for example, in a straight line, an angular line, a curve, or a circle.

The address marker recognition device is a camera or an RFID tag reader. The camera is used to collect signals of a bar code, a two-dimensional code, a graphic mark, a color mark or a size mark. The RFID card reader may be used to collect RFID signals.

Preferably, the plurality of Hall effect sensors forms a square shape, a rectangular shape, a circular shape, an oval shape or an II-shape, and the address marker recognition device is located at a central position. When the Hall effect sensors form a square shape, the Hall effect sensors can cover a larger area and easily collect signals of the magnetic strips.

It should be noted that the robot is provided with two wheels for traveling. The two wheels are located on two sides of the robot. When the plurality of Hall effect sensors forms the II shape, the two wheels are just located on the outer sides of two vertical lines of the II shape. The structure enables more Hall effect sensors to be installed, covers a larger area and has higher collection accuracy. When the plurality of Hall effect sensors forms a circular shape or an oval shape, the calculation in a software program is convenient because the shape has greater symmetry.

As the robot travels, output signals of the plurality of Hall effect sensors will change, so that the exact position of the robot can be obtained.

To improve magnetic signal collection sensitivity, a low-remanence high-permeability material plate is further included. The Hall effect sensors are installed close to the module area, and the low-remanence high-permeability material plate is secured above the Hall effect sensors and is close to the Hall effect sensors.

The robot includes a sorting robot, a transport robot, a loading/unloading robot and other types of travelling robots. The robot is in wireless connection with a server. After receiving instruction signals, the robot travels forward or backward or turns along a predetermined line to a target module area, performs a task such as unloading cargo into a container, and finally returns to a designated position such as a queue, a charge station, a parking area, or a loading station.

In the present invention where the technical solution of matching the magnetic strips with the Hall effect sensors is adopted, the coverage area is larger than that in the technical solution of using only a two-dimensional code, thus providing greater position reading accuracy. Furthermore, the present invention is not subjected to influence of blockage by a dust layer or foreign matter.

The module for robot navigation, the address marker and the associated robot, according to the present invention, have the beneficial effects of structural simplicity, low costs, reliable and accurate positioning, and convenient maintenance.

DESCRIPTION OF EMBODIMENTS

Figure 1:
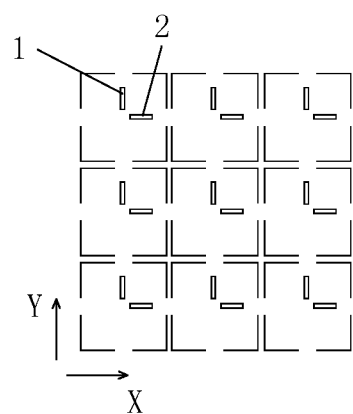
FIG. 1 is a schematic structural diagram of arranging a first magnetic strip and a second first magnetic strip in a module according to the present invention.

The present invention will be further described with reference to the accompanying drawings:

As shown in the drawing, Embodiment 1: modules for robot navigation divide a whole workspace area for robot travel into a plurality of module areas, and each module area is internally provided with:

a first magnetic piece having a polarity of North or South; and a second magnetic piece having a polarity different from the polarity of the first magnetic piece.

The first magnetic piece is a first magnetic strip 1 and the second magnetic piece is a second magnetic strip 2.

The first magnetic strip 1 is arranged in the Y-axis direction; and the second magnetic strip 2 is arranged in the X-axis direction (as shown in FIG. 1).

Figure 2:
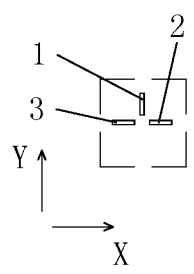
FIG. 2 is a schematic structural diagram of adding a third magnetic strip on the basis of FIG. 1.

Embodiment 2: on the basis of Embodiment 1, the following is further included:

a third magnetic strip 3 arranged in the X-axis direction, where the polarity of the third magnetic strip 3 is the same as the polarity of the second magnetic strip 2 (as shown in FIG. 2).

Figure 3:
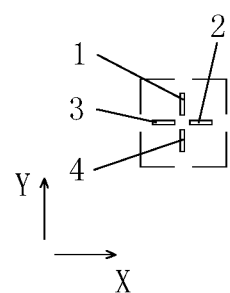
FIG. 3 is a schematic structural diagram of adding a fourth magnetic strip on the basis of FIG. 2.

Embodiment 3: on the basis of Embodiment 2, the following is further included:

a fourth magnetic strip 4 arranged in the Y-axis direction, where the polarity of the fourth magnetic strip 4 is the same as the polarity of the second magnetic strip 2 and the polarity of the third magnetic strip 3 (as shown in FIG. 3).

Figure 4:
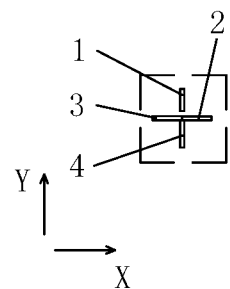
FIG. 4 is a schematic structural diagram illustrating that the magnetic strips having different polarities do not intersect and the magnetic strips having the same polarity may intersect in the module according to the present invention.

The magnetic strips having different polarities do not intersect, and the magnetic strips having the same polarity may or may not intersect (as shown in FIG. 4).

The first magnetic strip 1, the second magnetic strip 2, the third magnetic strip 3 and the fourth magnetic strip 4 are in a cross formation.

The distances between the cross center and the farthest ends of the first magnetic strip 1, the second magnetic strip 2, the third magnetic strip 3 and the fourth magnetic strip 4 are the same.

The magnetic strips are directly attached to the module area, or each module area is provided with a magnetic material plate, and the magnetic material plate is directly magnetized to form the North-polarity or South-polarity magnetic strips.

The plurality of module areas is arranged in a matrix, and the module areas are square.

Figure 5:
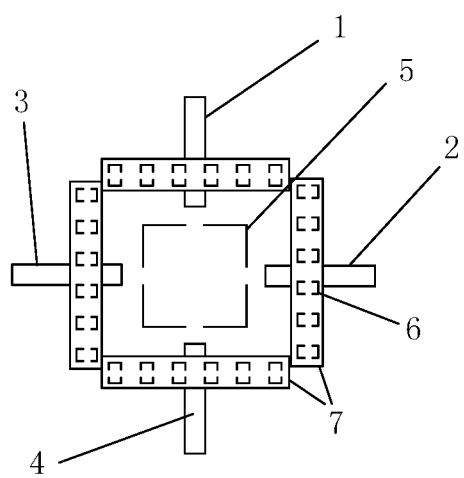
FIG. 5 is a schematic structural diagram of a robot traveling over a module fiducial marker according to the present invention.

A module for robot navigation includes the module fiducial markers and further includes address markers 5. Each module area is provided with a unique address marker 5 (as shown in FIG. 5).

The address marker 5 is a bar code, a two-dimensional code, a graphic mark, a color mark, a size mark, or an RFID tag.

A robot travels over the markers and a plurality of magnetic induction sensors and an address marker recognition device are installed at the bottom of the robot. The plurality of magnetic induction sensors can collect signals of the magnetic strips having different polarities, and the address marker recognition device can collect the address markers. The plurality of magnetic induction sensors and the address marker recognition device are connected to a robot controller, and the robot can travel forward or backward or turn to a target module area according to instructions and collected marker information.

The magnetic induction sensors are the Hall effect sensors 6. The Hall effect sensors 6 are usually 0.5-2 cm away from the ground, and can collect signals of the magnetic strips in a non-contact mode. The Hall effect sensors 6 will have a different voltage output when collecting North-polarity or South-polarity magnetic signals.

The address marker recognition device is a camera or an RFID card reader.

Figure 7:
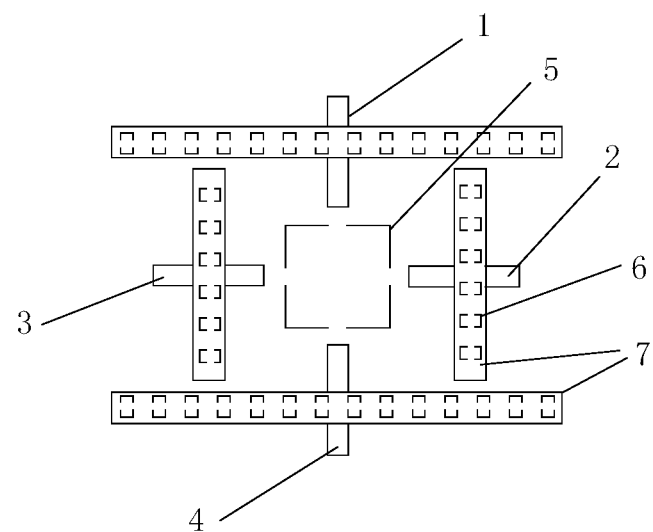
FIG. 7 is a schematic structural diagram of the Hall effect sensors forming an II shape.
Figure 8:
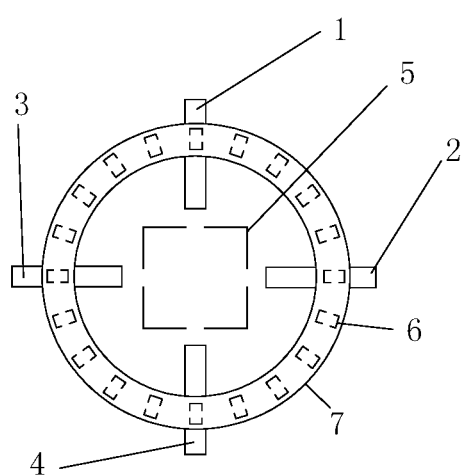
FIG. 8 is a schematic structural diagram of the Hall effect sensors forming a circular shape.

The plurality of Hall effect sensors forms a square shape (as shown in FIG. 5), a rectangular shape, a circular shape (as shown in FIG. 8), an oval shape or a II shape (as shown in FIG. 7), and the address marker recognition device is located at a central position (as shown in FIG. 5).

As can be seen from FIGS. 5, 7 and 8, the robot can also be positioned without arranging the fourth magnetic strip 4 and the third magnetic strip 3.

Figure 6:
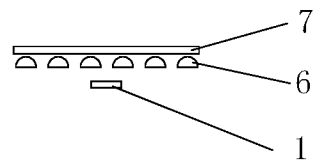
FIG. 6 is a schematic structural diagram of magnetic strips, Hall effect sensors and a low-remanence high-permeability material plate according to the present invention.

A low-remanence high-permeability material plate 7 is further included. The Hall effect sensors 6 are installed close to the module area, and the low-remanence high-permeability material plate 7 is secured above the Hall effect sensors 6 and is close to the Hall effect sensors 6 (as shown in FIG. 6).

Usually, the low-remanence high-permeability material plate 7 is wider than the Hall effect sensor 6.

The robot includes a sorting robot, a transportation robot, a loading/unloading robot or other types of traveling robots. The robot is in wireless connection with a server. After receiving instruction signals, the robot travels forward or backward or turns along a predetermined line to a target module area to perform a task such as loading or unloading cargo.

What is claimed is:

1. A module for robot navigation, wherein the module comprises a whole workspace area for robot traveling divided into a plurality of module areas, and each module area is internally provided with:
    a first magnetic strip arranged in a Y-axis direction;
    a second magnetic strip; arranged in an X-axis direction;
    a third magnetic strip arranged in the X-axis direction;
    a fourth magnetic strip arranged in the Y-axis direction, and
    a unique address marker,
    wherein the unique address marker is surrounded by the first, second, third and fourth magnetic strips.

2. The module for robot navigation according to claim 1, wherein the first magnetic strip, the second magnetic strip, the third magnetic strip and the fourth magnetic strip are in cross arrangement.

3. The module for robot navigation according to claim 2, wherein distances between a cross center and the farthest ends of the first magnetic strip, the second magnetic strip, the third magnetic strip and the fourth magnetic strip are the same.

4. The module for robot navigation according to claim 1, wherein the magnetic strips are directly attached to the module area.

5. The module for robot navigation according to claim 1, wherein each module area is provided with a magnetic material plate, and the magnetic material plate is directly magnetized to form N-pole or S-pole magnetic strips.

6. The module for robot navigation according to claim 1, wherein the plurality of module areas is arranged in a matrix, and the module areas are square or rectangle.

7. The module for robot navigation according to claim 1, wherein the address marker is a bar code, a two-dimensional code, a graphic mark, a color mark, a size mark, or an RFID tag.

8. The module for robot navigation according to claim 1, wherein the unique address marker is positioned between the first magnetic strip and the second magnetic strip.

9. A robot, configured for interacting with a module for robot navigation, wherein the module comprises a whole workspace area for robot traveling divided into a plurality of module areas, wherein each module area is provided with a unique address marker, and each module area is internally provided with a first magnetic strip arranged in a Y-axis direction, a second magnetic strip arranged in an X-axis direction, and a third magnetic strip arranged in the X-axis direction, and a fourth magnetic strip arranged in the Y-axis direction, wherein the unique address marker is surrounded by the first, second, third and fourth magnetic strips, the robot comprising:

a plurality of magnetic induction sensors and an address marker recognition device installed on a bottom thereof;

wherein the plurality of magnetic induction sensors collect signals of magnetic strips having different polarities, and the address marker recognition device collects the address marker information, wherein the plurality of magnetic induction sensors and the address marker recognition device are connected to a robot controller, and the robot travels to a target module area according to instructions and collected marker information.

10. The robot according to claim 9, wherein the magnetic induction sensors are Hall effect sensors.

11. The robot according to claim 10, wherein a plurality of Hall effect sensors forms a square shape, a rectangular shape, a circular shape, an oval shape or a II shape, and the address marker recognition device is located at a central position.

12. The robot according to claim 11, wherein a low-remanence high-permeability material plate is further included; wherein the Hall effect sensors are installed proximal to the module area, and the low-remanence high-permeability material plate is secured above the Hall effect sensors and is close to the Hall effect sensors.

13. The robot according to claim 12, wherein the low-remanence high-permeability material plate is wider than the Hall effect sensors.

14. The robot according to claim 9, wherein the address marker recognition device is a camera or an RFID card reader or a barcode reader.

15. The robot according to claim 9, wherein the robot includes a sorting robot, a transport robot, a loading/unloading robot or other types of traveling robots, and the robot is in wireless connection with a server such that after receiving instruction signals, the robot travels forward or backward or turns along a predetermined line to a target module area to perform a task such as loading or unloading cargo.

16. The module for robot navigation according to claim 9, wherein the unique address marker is positioned between the first magnetic strip and the second magnetic strip.

* * * * *